US00RE39925E

(19) United States
(12) Reissued Patent
Mitchell et al.

(10) Patent Number: US RE39,925 E
(45) Date of Reissued Patent: Nov. 27, 2007

(54) FAST JPEG HUFFMAN ENCODING AND DECODING

(75) Inventors: Joan L. Mitchell, Longmont, CO (US); Albert N. Cazes, Mount Kisco, NY (US); Neil M. Leeder, Apex, NC (US)

(73) Assignee: International Business Machines Corporation, Armonk, NY (US)

(21) Appl. No.: 10/824,613

(22) Filed: Apr. 15, 2004

Related U.S. Patent Documents

Reissue of:
(64) Patent No.: 6,373,412
Issued: Apr. 16, 2002
Appl. No.: 09/736,445
Filed: Dec. 15, 2000

(51) Int. Cl.
*H03M 7/40* (2006.01)

(52) U.S. Cl. ..... 341/65; 341/51; 341/61
(58) Field of Classification Search ..... 341/65, 341/51, 61
See application file for complete search history.

(56) References Cited

U.S. PATENT DOCUMENTS 4,396,906 A * 8/1983 Weaver ..... 341/65
5,227,789 A * 7/1993 Barry et al. ..... 341/65
5,550,541 A * 8/1996 Todd ..... 341/51
5,652,582 A * 7/1997 Truong et al. ..... 341/65
5,686,915 A * 11/1997 Nelson et al. ..... 341/65
5,808,570 A * 9/1998 Bakhmutsky ..... 341/65
6,040,790 A * 3/2000 Law ..... 341/65
6,130,630 A * 10/2000 Grohs et al. ..... 341/51

* cited by examiner

*Primary Examiner*—Rexford Barnie
*Assistant Examiner*—Lam T. Mai
(74) *Attorney, Agent, or Firm*—Whitham, Curtis, Christofferson & Cook, PC; William H. Steinberg

(57) ABSTRACT

Huffman encoding, particularly from a packed data format, is simplified by using two different table formats depending on code length. Huffman tables are also reduced in size thereby. Decoding is performed in reduced time by testing for the length of valid Huffman codes in a compressed data stream and using an offset corresponding to a test criterion yielding a particular test result to provide a direct index into Huffman table symbol values while greatly reducing the size of look-up tables used for such a purpose.

8 Claims, 16 Drawing Sheets

HUFFMAN CODING OF AC COEFFICIENTS
& DC COEFFICIENT DIFFERENCES

| CATEGORY/S | AC COEFFICIENTS | PRECISION | |
|---|---|---|---|
| 0 | 0 | 8 | 12 |
| 1 | −1,1 | 8 | 12 |
| 2 | −3,−2,2,3 | 8 | 12 |
| 3 | −7,...,−4,4,...7 | 8 | 12 |
| 4 | −15,...,−8,8,...,15 | 8 | 12 |
| 5 | −31,...,−16,16,...,31 | 8 | 12 |
| 6 | −63,...,−32,32,...,63 | 8 | 12 |
| 7 | −127,...,−64,64,...,127 | 8 | 12 |
| 8 | −255,...,−128,128,...,255 | 8 | 12 |
| 9 | −511,...,−256,256,...,511 | 8 | 12 |
| 10 | −1023,...,−512,512,...,1023 | 8 | 12 |
| 11 | −2047,...,−1024,1024,...,2047 | 8 | 12 |
| 12 | −4095,...,−2048,2048,...,4095 | 8 | 12 |
| 13 | −8191,...,−4096,4096,...,8191 | | 12 |
| 14 | −16383,...,−8192,8192,...,16383 | | 12 |
| 15 | −32767,...,−16384,16384,...,32767 | | 12 |

FIG. 1A

```
(SOI)  FFD8
(DQT)  FFDB  00 84 00 10 0B 0C 0E 0C 0A 10 0E 0D 0E 12 11 10
             13 18 28 1A 18 16 16 18 31 23 25 1D 28 3A 33 3D
             3C 39 33 38 37 40 48 5C 4E 40 44 57 45 37 38 50
             6D 51 57 5F 62 67 68 67 3E 4D 71 79 70 64 78 5C
             65 67 63 01 11 12 12 18 15 18 2F 1A 1A 2F 63 42
             38 42 63 63 63 63 63 63 63 63 63 63 63 63 63 63
             63 63 63 63 63 63 63 63 63 63 63 63 63 63 63 63
             63 63 63 63 63 63 63 63 63 63 63 63 63 63 63 63
             63 63 63 63
(SOF)  FFC0  00 11 08 02 40 02 D0 03 01 21 00 02 11 01 03 11
             01    Tc Th          Li                DC TABLE 0
(DHT)  FFC4  01 A2 00 00 01 05 01 01 01 01 01 01 00 00 00 00  Tc
Lh           00 00 00 00 01 02 03 04 05 06 07 08 09 0A 0B 10  Th
Li           00 02 01 03 03 02 04 03 05 05 04 04 00 00 01 7D
             01 02 03 00 04 11 05 12 21 31 41 06 13 51 61 07
             22 71 14 32 81 91 A1 08 23 42 B1 C1 15 52 D1 F0
             24 33 62 72 82 09 0A 16 17 18 19 1A 25 26 27 28
             29 2A 34 35 36 37 38 39 3A 43 44 45 46 47 48 49
             4A 53 54 55 56 57 58 59 5A 63 64 65 66 67 68 69
AC TABLE 0   6A 73 74 75 76 77 78 79 7A 83 84 85 86 87 88 89
             8A 92 93 94 95 96 97 98 99 9A A2 A3 A4 A5 A6 A7
             A8 A9 AA B2 B3 B4 B5 B6 B7 B8 B9 BA C2 C3 C4 C5
             C6 C7 C8 C9 CA D2 D3 D4 D5 D6 D7 D8 D9 DA E1 E2
             E3 E4 E5 E6 E7 E8 E9 EA F1 F2 F3 F4 F5 F6 F7 F8
             F9 FA 01 00 03 01 01 01 01 01 01 01 01 01 00 00  DC TABLE 1
Tc Th        00 00 00 00 01 02 03 04 05 06 07 08 09 0A 0B 11  Th
Li           00 02 01 02 04 04 03 04 07 05 04 04 00 01 02 77  Tc
Li           00 01 02 03 11 04 05 21 31 06 12 41 51 07 61 71
             13 22 32 81 08 14 42 91 A1 B1 C1 09 23 33 52 F0
             15 62 72 D1 0A 16 24 34 E1 25 F1 17 18 19 1A 26
             27 28 29 2A 35 36 37 38 39 3A 43 44 45 46 47 48
             49 4A 53 54 55 56 57 58 59 5A 63 64 65 66 67 68
             69 6A 73 74 75 76 77 78 79 7A 82 83 84 85 86 87  AC TABLE 1
             88 89 8A 92 93 94 95 96 97 98 99 9A A2 A3 A4 A5
             A6 A7 A8 A9 AA B2 B3 B4 B5 B6 B7 B8 B9 BA C2 C3
             C4 C5 C6 C7 C8 C9 CA D2 D3 D4 D5 D6 D7 D8 D9 DA
             E2 E3 E4 E5 E6 E7 E8 E9 EA F2 F3 F4 F5 F6 F7 F8
             F9 FA
(SOS)  FFDA  00 0C 03 01 00 02 11 03 11 00 3F 00 ...  CODED COMPRESSED
       FFD9                                          DATA
             # OF BYTES  # OF COMPONENTS
```

FIG. 2
(PRIOR ART)

| R/S | CATEGORY (=S) | CODE LENGTH | CODE WORD |
|---|---|---|---|
| 0/0 | 0 | 2 | 00 |
| 0/1 | 1 | 3 | 010 |
| 0/2 | 2 | 3 | 011 |
| 0/3 | 3 | 3 | 100 |
| . | 4 | 3 | 101 |
| . | 5 | 3 | 110 |
| . | 6 | 4 | 1110 |
| | 7 | 5 | 11110 |
| | 8 | 6 | 111110 |
| | 9 | 7 | 1111110 |
| | 10 | 8 | 11111110 |
| 0/11 | 11 | 9 | 111111110 |

FIG. 3
(PRIOR ART)

| R/S | CATEGORY (=S) | CODE LENGTH | CODE WORD |
|---|---|---|---|
| 0/0 | 0 | 2 | 00 |
| 0/1 | 1 | 2 | 01 |
| 0/2 | 2 | 2 | 10 |
| 0/3 | 3 | 3 | 110 |
| . | 4 | 4 | 1110 |
| . | 5 | 5 | 11110 |
| . | 6 | 6 | 111110 |
| | 7 | 7 | 1111110 |
| | 8 | 8 | 11111110 |
| | 9 | 9 | 111111110 |
| | 10 | 10 | 1111111110 |
| 0/11 | 11 | 11 | 11111111110 |

FIG. 4
(PRIOR ART)

FAST JPEG HUFFMAN ENCODING AND DECODING

Matter enclosed in heavy brackets [ ] appears in the original patent but forms no part of this reissue specification; matter printed in italics indicates the additions made by reissue.

CROSS-REFERENCE TO RELATED APPLICATIONS

This application is related to U.S. patent applicaton Ser. No. 09/736,444 filed concurrently herewith, assigned to the Assignee of the present invention and which is hereby fully incorporated by reference.

BACKGROUND OF THE INVENTION

1. Field of the Invention

The present invention generally relates to image compression for diverse applications and, more particularly, in combination with a structure for storing Discrete Cosine Transform (DCT) blocks in a packed format, performing Huffman entropy encoding and decoding in accordance with the JPEG (Joint Photographic Experts Group) standard.

2. Description of the Prior Art

Pictorial and graphics images contain extremely large amounts of data and, if digitized to allow transmission or processing by digital data processors, often requires many millions of bytes to represent respective pixels of the image or graphics with good fidelity. The purpose of image compression is to represent images with less data in order to save storage costs or transmission time and costs. The most effective compression is achieved by approximating the original image, rather than reproducing it exactly. The JPEG standard, discussed in detail in "JPEG Still Image Data Compression Standard" by Pennebaker and Mitchell, published by Van Nostrand Reinhold, 1993, which is hereby fully incorporated by reference, allows the interchange of images between diverse applications and opens up the capability to provide digital continuous-tone color images in multi-media applications.

JPEG is primarily concerned with images that have two spatial dimensions, contain gray scale or color information, and possess not temporal dependence, as distinguished from the MPEG (Moving Picture Experts Group) standard. JPEG compression can reduce the storage requirements by more than an order of magnitude and improve system response time in the process. A primary goal of the JPEG standard is to provide the maximum image fidelity for a given volume of data and/or available transmission or processing time and any arbitrary degree of data compression is accommodated. It is often the case that data compression by a factor of twenty or more (and reduction of transmission or processing time by a comparable factor) will not produce artifacts which are noticeable to the average viewer.

One of the basic building blocks for JPEG is the Discrete Cosine Transform (DCT). An important aspect of this transform is that it produces uncorrelated coefficients. Decorrelation of the coefficients is very important for compression because each coefficient can be treated independently without loss of compression efficiency. Another important aspect of the DCT is the ability to quantize the DCT coefficients using visually-weighted quantization values. Since the human visual system response is very dependent on spatial frequency, by decomposing an image into a set of waveforms, each with a particular spatial frequency, it is possible to separate the image structure the eye can see from the image structure that is imperceptible. The DCT thus provides a good approximation to this decomposition to allow truncation or omission of data which does not contribute significantly to the viewer's perception of the fidelity of the image.

In accordance with the JPEG standard, the original monochrome image is first decomposed into blocks of sixty-four pixels in an 8×8 array at an arbitrary resolution which is presumably sufficiently high that visible aliasing is not produced. (Color images are compressed by first decomposing each component into an 8×8 pixel blocks separately.) Techniques and hardware is known which can perform a DCT on this quantized image data very rapidly, yielding sixty-four DCT coefficients. Many of these DCT coefficients for many images will be zero (which do not contribute to the image in any case) or near-zero which can be neglected or omitted when corresponding to spatial frequencies to which the eye is relatively insensitive. Since the human eye is less sensitive to very high and very low spatial frequencies, as part of the JPEG standard, providing DCT coefficients in a so-called zig-zag pattern which approximately corresponds to an increasing sum of spatial frequencies in the horizontal and vertical directions tends to group the DCT coefficients corresponding less important spatial frequencies at the ends of the DCT coefficient data stream, allowing them to be compressed efficiently as a group in many instances.

While the above-described discrete cosine transformation and coding may provide significant data compression for a majority of images encountered in practice, actual reduction in data volume is not guaranteed and the degree of compression is not optimal, particularly since equal precision for representation of each DCT coefficient would require the same number of bits to be transmitted (although the JPEG standard allows for the DCT values to be quantized by ranges that are coded in a table). That is, the gain in compression developed by DCT coding derives largely from increased efficiency in handling zero and near-zero values of the DCT coefficients although some compression is also achieved through quantization that reduces precision. Accordingly, the JPEG standard provides a second stage of compression and coding which is known as entropy coding.

The concept of entropy coding generally parallels the concept of entropy in the more familiar context of thermodynamics where entropy quantifies the amount of "disorder" in a physical system. In the field of information theory, entropy is a measure of the predictability of the content of any given quantum of information (e.g. symbol) in the environment of a collection of data of arbitrary size and independent of the meaning of any given quantum of information or symbol. This concept provides an achievable lower bound for the amount of compression that can be achieved for a given alphabet of symbols and, more fundamentally, leads to an approach to compression on the premise that relatively more predictable data or symbols contain less information than less predictable data or symbols and the converse that relatively less predictable data or symbols contain more information than more predictable data or symbols. Thus, assuming a suitable code for the purpose, optimally efficient compression can be achieved by allocating fewer bits to more predictable symbols or values (that are more common in the body of data and include less information) while reserving longer codes for relatively rare symbols or values.

As a practical matter, Huffman coding and arithmetic coding are suitable for entropy encoding and both are accommodated by the JPEG standard. One operational difference for purposes of the JPEG standard is that, while tables of values corresponding to the codes are required for both coding techniques, default tables are provided for arithmetic coding but not for Huffman coding. However, some particular Huffman tables, although they can be freely specified under the JPEG standard to obtain maximal coding efficiency and image fidelity upon reconstruction, are often used indiscriminately, much in the nature of a default, if the image fidelity is not excessively compromised in order to avoid the computational overhead of computing custom Huffman tables.

It should be appreciated that while entropy coding, particularly using Huffman coding, guarantees a very substantial degree of data compression if the coding or conditioning tables are reasonably well-suited to the image, the encoding, itself, is very computationally intensive since it is statistically based and requires collection of statistical information regarding a large number of image values or values representing them, such as DCT coefficients. Conversely, the use of tables embodying probabilities which do not represent the image being encoded could lead to expansion rather than compression if the image being encoded requires coding of many values which are relatively rare in the image from which the tables were developed even though such a circumstance is seldom encountered.

It is for this reason that some Huffman tables have effectively come into standard usage even though optimal compression and/or optimal fidelity for the degree of compression utilized will not be achieved. Conversely, compression efficiency of Huffman ending can usually be significantly increased and greater image fidelity optimally maintained for a given number of bits of data by custom Huffman tables corresponding to the image of interest but may be achievable only with substantial computational burden for encoding.

Another inefficiency of Huffman coding characteristically is encountered when the rate of occurrence of any particular value to be encoded rises above 50% due to the hierarchical nature of the technique of assigning Huffman codes to respective coded values and the fact that at least one bit must be used to represent the most frequently occurring and most predictable value even though the information contained therein may, ideally, justify less. For example, if the rate of occurrence of a single value rises to 75%, the efficiency of Huffman coding drops to 86%. As a practical matter, the vast majority of DCT coefficients are (or are quantized to) zero and substantial inefficiencies are therefore frequently encountered in Huffman encoding of DCT coefficients or DCT coefficient differences. For the AC coefficients, the JPEG committee solved this problem by collecting runs of zero-valued coefficient together and not coding the individual zero-valued coefficients. Thus the likelihood of a Huffman symbol occurring more than half the time is greatly reduced.

Huffman decoding also requires a substantial computational burden since the compression efficiency derives largely from a variable length code that requires additional processing to detect the ending point of respective values or symbols. Additionally, this processing is achieved through use of coding tables which must be transmitted with the entropy coded image data and may change with every image. Complexity of access to data in tables is aggravated by the fact that Huffman codes are of variable length in order to allocate numbers of bits in accordance with the predictability of the data or amount of data contained in a particular symbol or value. To increase response speed it has been the practice to compute and store look-up tables from the Huffman tables which can then be used for decoding. Therefore, at least two bytes of table data must often be accessed per code word.

Moreover, since sixteen bit Huffman code lengths are allowed, a prior art method of decoding would access a Huffman table with a $2^{16}$ entries for the symbol values and $2^{16}$ entries for the code length. These entries must be computed each time a Huffman table is specified or changed. Up to fours DC and four AC tables could be needed to decode and interleaved baseline four-component image. For hardware with small on-chip caching or RAM, such large tables will degrade performance because extra processing cycles are needed with every cache miss or RAM access.

SUMMARY OF THE INVENTION

It is therefore an object of the present invention to provide a technique of Huffman encoding and decoding which can be accomplished in much reduced time with reduced processing resources and hardware.

It is another object of the invention to provide a technique of Huffman encoding and decoding which is enhanced through use of a packed intermediate data format.

In order to accomplish these and other objects of the invention, a method of Huffman encoding symbols is provided comprising steps of defining a seed value for the first occurrence of a code of a given length in a table, storing a length of a code word, storing the length and the code word in a first format when a number of bits of said number and said code word are less than or equal to a predetermined number of bits, and storing an index to the seed value, an offset and the code word in a second format when the number and the image data comprise a number of bits greater than the predetermined number of bits.

In accordance with another aspect of the invention, a method of Huffman decoding compressed data is provided including steps of testing bits of a data stream with each of a plurality of test criteria to determine a length of a valid Huffman code, combining one of a plurality of offsets corresponding to the length with the valid Huffman code to form an index, and accessing a symbol value in a Huffman table using the index.

BRIEF DESCRIPTION OF THE DRAWINGS

The foregoing and other objects, aspects and advantages will be better understood from the following detailed description of a preferred embodiment of the invention with reference to the drawings, in which:

FIG. 1A depicts the Huffman coding of AC DCT coefficients or DC DCT coefficient differences, FIG. 2 depicts an exemplary Huffman table specification and entropy encoded image data in accordance with the JPEG standard, FIGS. 3 and 4 are typical tables of Huffman codes appropriate for luminance and chrominance DC DCT coefficient difference values, respectively.

DETAILED DESCRIPTION OF A PREFERRED EMBODIMENT OF THE INVENTION

Figure 1:
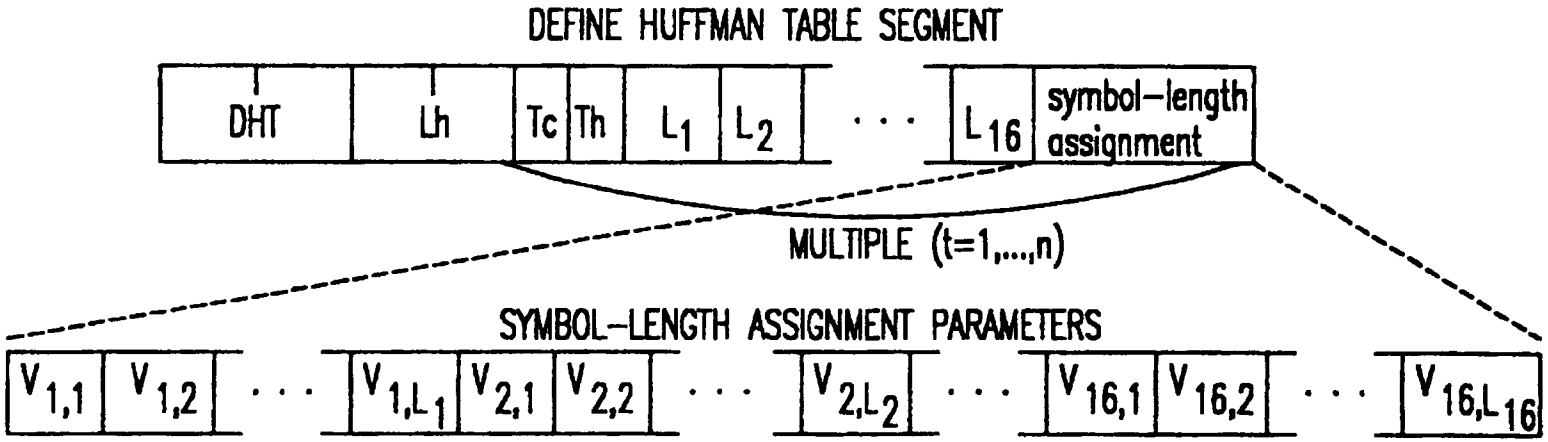
FIG. 1 (PRIOR ART)
FIG. 1 is a diagram illustrating Huffman table specification syntax in accordance with the JPEG standard.

Referring now to the drawings, and more particularly in FIG. 1, there is shown a diagram of the Huffman table specification syntax in accordance with the JPEG standard included in the above referenced Pennebaker et al publication at page 393. The illustrated syntax is referred to as a marker segment which is used to define one or more Huffman coding tables which will be thereafter used to perform Huffman entropy encoding or decoding. The same syntax is used whenever new parameters or table values are to be changed. Marker segments always contain an integral number of bytes (sometimes achieved by adding bits of a given logical value at the end of the segment) and marker segments applied to start of frame (SOF) and start of scan (SOS) blocks of code are often referred to as headers.

The marker segment in accordance with the JPEG standard, as shown in FIG. 1 always begins with a two byte code beginning with a byte-aligned hexadecimal "FF" byte followed by a non-zero byte specifying the function of the marker, such as "FFDB" representing "define quantization table" (DQT) or "FFC4" representing "define Huffman tables" (DHT). Specifically as applied to the "define Huffman tables function, the following two bytes specify the length of parameter fields, $L_h$ provided in the marker segment. A bit in the first nibble of the following byte, Tc, specifies the class of the immediately following table as DC or AC ("0" or "1") and bits in the next following nibble, Th, specifies the name of the table. Up to four tables each of DC and AC tables are permitted and the marker segment can be used to define or redefine any or all of the tables.

The next sixteen bytes specify the number of codes of each hit length, Li, that will be included in the following table to correspond to the maximum bit length allowed under the JPEG standard (but is otherwise arbitrary). As a notation convention, the number of one-bit codes is 1.1 and the number of sixteen-bit codes is L16. Not all bit lengths will be represented, particularly if the image precision is eight bits which, after quantization yields coefficients of, at most, eleven bits and all code lengths which are not represented in image data will be coded as hexidecimal "00". The following bytes, $V_{1.1}$ to $V_{16,\ t.16}$ are the actual values corresponding to each Huffman code, in order of the respective frequency/likelihood of occurrence (including instances where more than one code of a given length are provided).

It should be recalled that entropy coding such as Huffman coding assigns the fewer bits to values with greater frequency or likelihood of occurrence and many of the DCT coefficients could be zero. Therefore, the JPEG standard provides for many as eight Huffman tables each having as many as 256 entries (and assures that the mapping of particular Huffman codes to particular DCT coefficients are always defined). To speed this process, look-up tables may also be provided to index into the $V_{ij}$ fields of the Huffman tables which may reduce the number of operations to find a particular $V_{ij}$ value but requires additional memory resources and presents an additional computational burden to develop larger numbers of table entries, as alluded to above.

Application of the marker segment syntax will now be explained in connection with the exemplary Huffman tables of FIG. 2. As introduction it should be understood that the result of quantization and discrete cosine transformation (DCT) in the compression process is a sequence of DCT coefficients in raster scan order. Zero-valued coefficients are roughly grouped by accessing them in zig-zag order and further compression (and enhancement of other transformation processes including entropy coding) obtained by packing data in accordance with run and size (R/S) data as disclosed in the above incorporated, concurrently filed related application. Runs are the length of consecutive strings of zero-valued AC DCT coefficients and the size is the number of bits necessary to specify a non-zero DCT coefficient. The run or R value is coded as the more significant four-bit nibble of a byte and the size or S value is specified as the less significant four-bit nibble of the same R/S byte.

It should be recognized that DC DCT coefficient differences and AC DCT coefficient values are not fully specified by the R/S values. However, encoding only the R/S vales in accordance with the JPEG standard and concatenating or appending to each code the actual bits of a positive AC DCT coefficient or DC DCT coefficient difference values and bits modified according to a suitable convention for negative AC DCT coefficient or DC DCT coefficient difference values as shown in FIG. 1A is sufficient to contain all of the original DCT coefficient information while providing very substantial data compression as will be discussed below, while complying with the JPEG standard in all particulars.

For clarity, FIG. 2 is shown right-justified in sixteen columns such that two byte markers extend to the left. Each byte is represented by two hexadecimal-coded digits representing two respective nibbles thereof.

The first marker in FIG. 2 is "FFD8" representing a start of image (SOI). The second marker is "FFDB" representing a specification of a quantization table. It should be understood that the value of a quantized SCT coefficient need not represent a range of values of fixed size but, rather, each can represent a range of values of differing size than others. This table is developed from an analysis of the DCT coefficients corresponding to the original image in a manner not important to an understanding of the invention and will be used subsequently to "dequantize" the DCT coefficients during reconstruction of the image.

The third marker is "FFC4" which represents the beginning of a marker segment specifying one or more Huffman tables. The following two bytes "01 A2" are hexadecimal code for four hundred eighteen which is the number of bytes prior to the next marker "FFDA" representing start of scan (SOS) where the length of a parameter list is specified beginning with the number of components (e.g. R, G or B, grey scale, luminance/chrominance, etc., and followed by compressed data schematically indicated by " . . . ".

The next byte contains two nibbles representing Tc and Th and defining the table as DC table 0 since both nibbles are zero. Since these are DC tables and only one DC DCT coefficient is provided per block, there are no run lengths and the first nibble of each byte is zero while the second nibble specifies the number of extra bits of each size (which is the number of extra bits following next in the compressed data stream). The particular numbers of codes corresponds to the Huffman codes shown in FIG. 3, of which there are only twelve, including five codes of three-bit length. These twelve values are specified in the next twelve bytes to complete DC table 0.

At this point, only 29 bytes (1 for Tc, Th, 16 for Li and 12 for $V_{ij}$) have been used which is much less than four hundred eighteen bytes of parameter length specified immediately after the marker. Therefore the two nibbles of the next byte define a class and name for the second Huffman table specified in this marker segment, in this case, AC table 0 since the Tc and Th values are 1 and 0, respectively. The following sixteen bytes are $L_i$ values indicating the number of codes of each length and the next following bytes, equal in number to the sum of the codes enumerated in the $L_i$ bytes to a maximum of sixty-four, are $V_{ij}$ symbol values for respective ones of the Huffman codes in descending order of frequency of occurrence to complete AC table 0.

The remainder of the four hundred eighteen are comprised of two more tables, DC table 1 and AC table 1, delineated and coded in the same format discussed above. The Huffman codes for DC table 1 are tabulated in FIG. 4.

From a comparison of FIGS. 3 and 4, several characteristics of Huffman codes may be discerned. First, as discussed above, Huffman codes are of variable length and the "category" is the number of bits or the size or S value included in R/S bytes discussed above and in the above-incorporated application and recorded as the $V_{ij}$ values in the Huffman tables such as FIG. 2. Second, codes comprised entirely of "1" valued bits are not allowed. Third, a plurality of codes of a given length are permitted and the plurality will be smaller that the number of values that could be represented by a code of that length. Fourth, and most importantly for an understanding of the invention, JPEG Huffman codes are constructed to represent hierarchically distinguished values. This constraint or quality is manifested in the characteristic that no code is allowed that would be the same as a prefix of any other code of greater length.

It will be recalled from the foregoing that The structure of the Huffman tables allows the correspondence of particular Huffman codes and the R/S values respectively assigned thereto to be reconstructed. However, as alluded to above, such a reconstruction is complex and time-consuming and it is much more common to use look-up tables to index into the Huffman tables. This process is complicated by the fact that Huffman codes are of variable length and the number (sixteen or fewer) of consecutive bits which corresponds to a valid Huffman code must also be recognized.

A known method of recognizing a valid Huffman code and indexing into the Huffman tables would be to take sixteen (next) consecutive bits in the compressed data and look up (in a table having $2^{16}$ entries) the number of bits in the code and, in another table (of similar size), look up the R/S byte corresponding to the code. However, this is very wasteful in terms of storage space as well as causing a substantial memory burden. For example, if the code was a one-bit code (at the beginning of the sixteen bits examined, half of each table would have a "1" for the number of bits and the same R/S value byte for the symbol. Other known methods use multiple tables and require a correspondingly greater number of look-up operations.

The invention exploits the characteristic of Huffman codes that each code can be considered to have a numeric value for any given number of binary bits and that a numeric value that is too large for a given number of bits can be calculated. If n bits of compressed data are logically greater than or equal to this maximum value (hereinafter max(n) where n=number of bits), an additional bit must be examined and compared to max(n+1). The invention also explains the fact that, in terms of hardware architecture, these tests can be carried out in parallel since all tests will pass (e.g., the logical value is too large for a valid Huffman code) until the correct number of bits is considered and the remainder of the tests on larger numbers of bits will fail.

Figure 5:
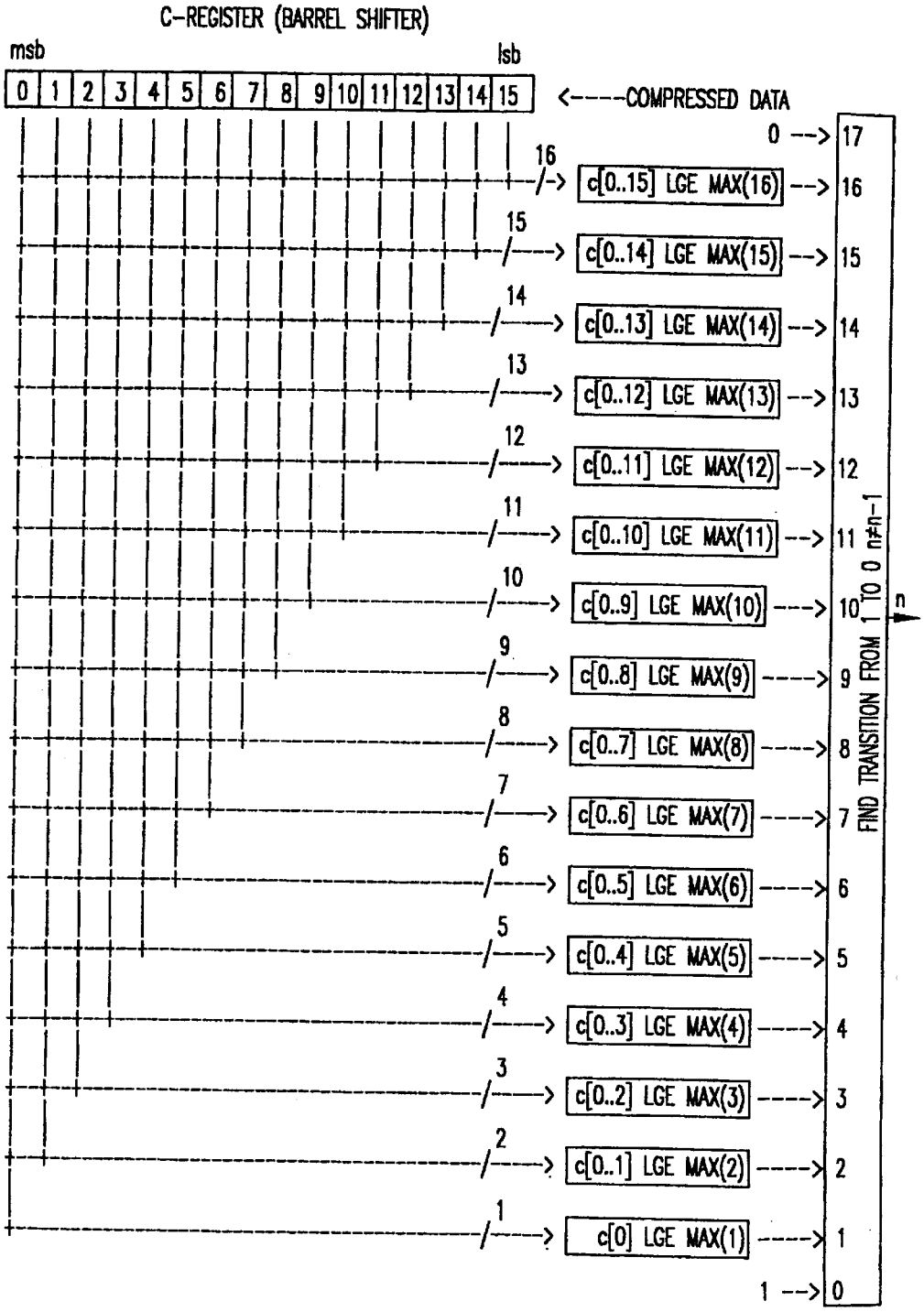
FIGS. 5 and 5A are schematic representations of alternative hardware embodiments usable in the practice of the invention.

For example, as shown in FIG. 5, this testing could be performed in parallel using sixteen comparators (represented in FIG. 5 by the expression C[0 . . . n]≧max(n), each having one to sixteen inputs connected to consecutive stages of a C-register such as a barrel shifter. These comparators could be digital and configured as logic gate arrays.

That is, the first test compares the current most significant bit in the C-register (MSB(C[0])) against max(1), a one bit value. If there are no one-bit codes, max(1)=0. If there is a one-code (which must be "0" since all "1" codes are disallowed) max(1)=1. There will be a non-zero max(n) for the first $L_n$ that has some codes since max(n) values are constructed such that max(n) is the first code of n bits that is the prefix to a longer code word (e.g. max(2)="10" which is the prefix of category 5 of FIG. 3).

FIG. 5B shows an alternative embodiment in which more and more bits of the compressed data are compared against max(n) values. The value of n is determined to be the first value for which the comparison fail (produces a zero).

Figure 6:
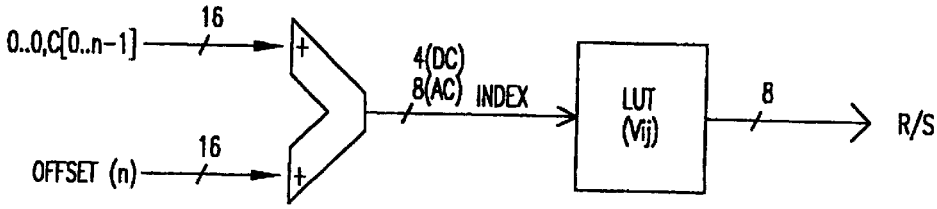
FIG. 6 is a schematic representation of some additional details of a hardware embodiment usable in the practice of the invention.

FIG. 6 shows leading zeros concatenated to the n most significant bits of the C-register as one input to an arithmetic logic unit (ALU). The other input is the precalculated offset(n). After addition, the low order result is an index (four bits of the DC differences of eight bits for AC coding) into the look-up table (LUT)/Huffman table that contains the $V_{ij}$ symbol values passed in the Define Huffman Table (DHT) marker segment. Output of the table is the R/S byte.

Figure 5A:
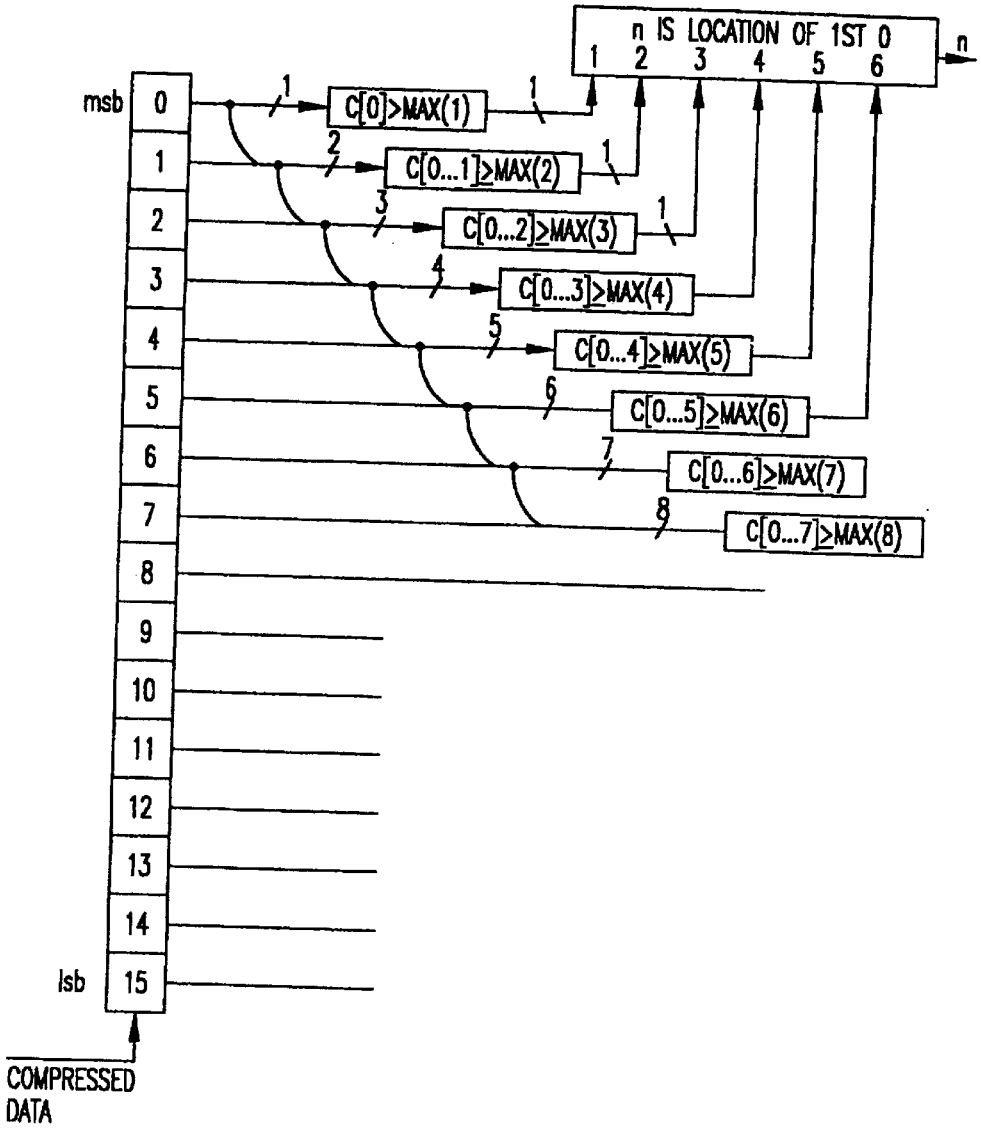
Figure 7:
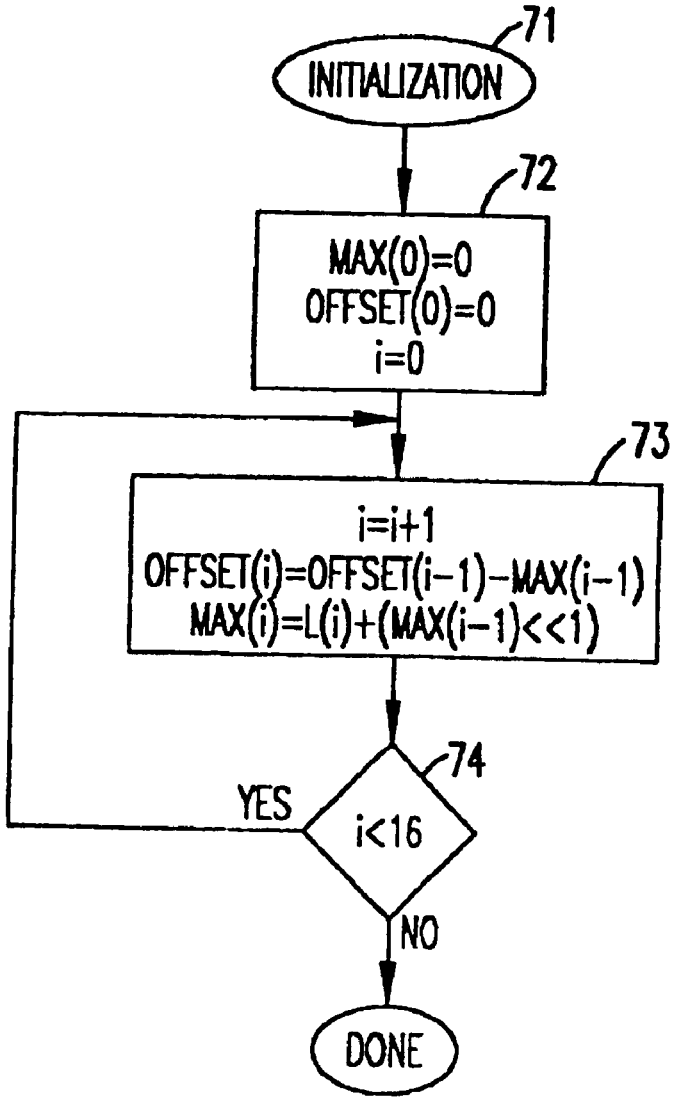
FIG. 7 is a flow chart showing a preferred form of computation of comparison values and Huffman table pointer data in accordance with the invention.

FIG. 7 shows a flow chart for the construction of max(n) values. This methodology also constructs the offsets into the R/S bytes as specified in the DHT marker segment of FIG. 2 where offset(0) is the index (e.g. 0) of the first byte of the R/S list or a pointer to the list. The initialization max(n) and offset (n) 71 starts with the setting of i, max(0) and offset(0) to zero at step 72, i is incremented and the offset is set to the last offset less max(i−1). The value of max(i) is computed as $L_i$+max(i−1). Thus, until $L_i$ is non-zero, the offset(n) and Max(n) will stay zero. Thus, the first comparisons C[0 . . . n] of FIG. 5 or 5A will always pass because the logical/numerical value of the first bit(s) is always greater than or equal to zero until a non-zero $L_i$ (indicating existence of at least one code of that length) is encountered. When a non-zero (i.e. "1") $L_i$ is encountered adding it to zero will set max(i) to the first code that is a prefix to a larger code, as indicated at 73. This process is repeated for i<16 to generate all possible max(n) for all $L_n$. Thus, for example, if there are five three-bit codes, e.g. 0, 1, 2, 3 and 4), max(3) will be set to 5 and the value 5 (binary "101" is part of a longer possible code although that particular code will not necessarily be used if there are no more codes. Thus, max(i) points to the first code of i bits that is too big (i.e. a code that is one value greater than the largest code i bits). If L(i+1) is not null (e.g. there is a code that is one bit larger), then the value of the code is twice max(i). The i+1 codes start at 2*max(i) and are sequentially numbered and max(i+1) is the next number after that sequence (i.e. 2*max(i)+L(i+1). If L(i+1)=0, then max(i+1) will equal 2*max (i) and there may be several such doublings before the next non-zero $L_i$.

More generically, max(i) and offset (i) in terms of $L_i$ are computed as follows:

(i=0

(max(0)=0

(offset(0)=0

(i=1

(max(1)=$L_1$+2*0

(offset(1)=0−0=0

(i=2

(max(2)=$L_2$+2*$L_1$ (offset(2)=0−$L_1$

Offset (i) is used to determine where in the list of R/S values the decoded value corresponding to the code is located. That is, if i bits of the Huffman code are added to offset(i), the resulting value will be the address in the Huffman table where the corresponding R/S byte will be found. This provides several very important advantages in the context of the invention. Specifically, the function of a plurality of look-up tables, each having $2^{16}$ entries are replaced by tables of max(n) and offset(n) values limited to sixteen entries and which can be very rapidly computed and efficiently stored. Since this table is singular and small, data therein may be retrieved very rapidly to provide a direct index into the Huffman tables to obtain R/S data that is used to evaluate the DCT coefficient and coefficient difference data included with the Huffman codes in the data stream in the JPEG standard syntax (which can be utilized with other processing techniques and for other types of data).

Figure 8:
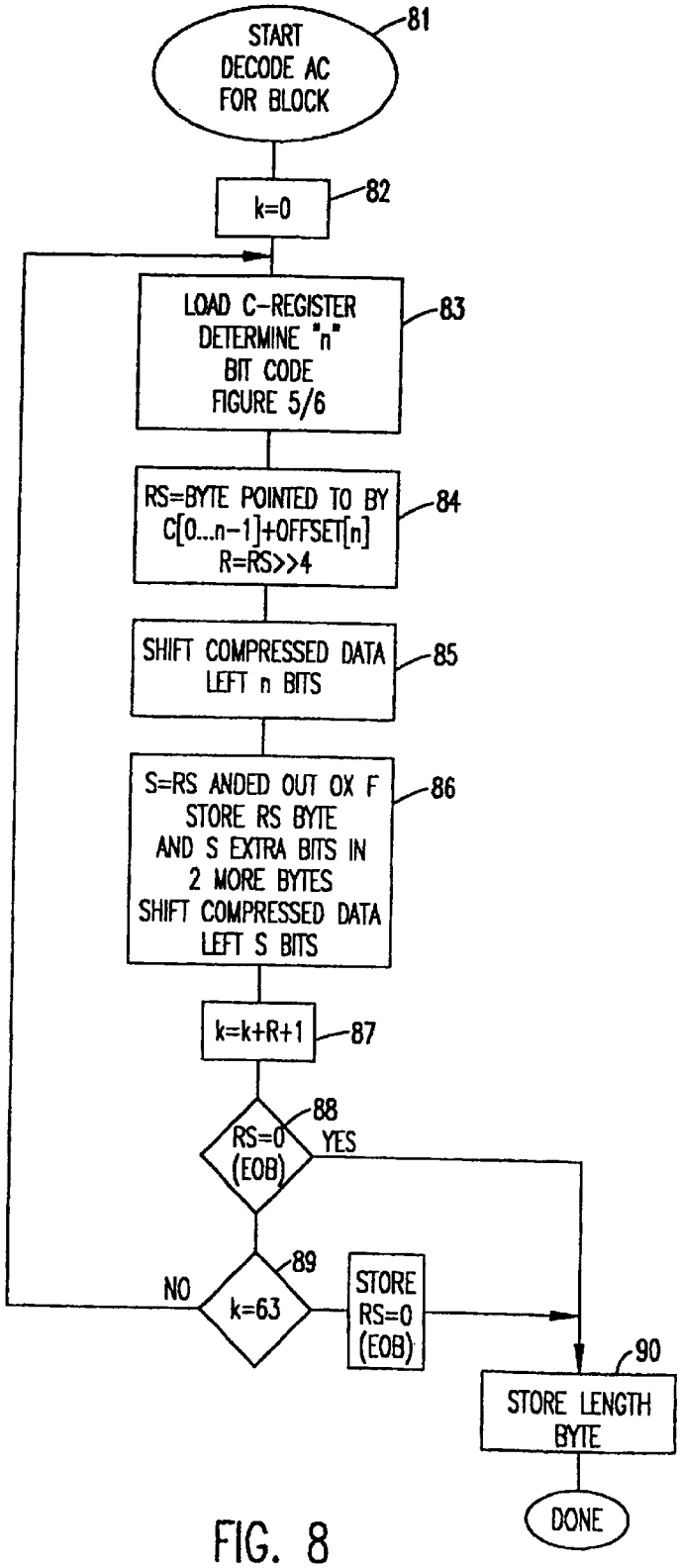
FIG. 8 is a flow chart showing the methodology of the invention in decoding compressed data including Huffman encoded R/S values.
Figure 10:
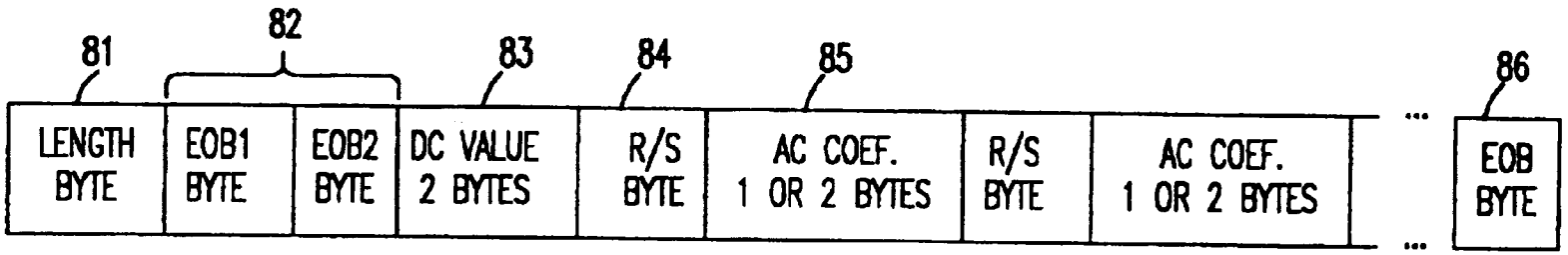
FIG. 10 illustrates a packed intermediate data format from which Huffman encoding can be rapidly performed.

In summary, the decoding of compressed data is illustrated in FIG. 8 and a preferred perfecting feature thereof will be discussed below in connection with FIGS. 9A–9C. When the process is started 81, k, the number of the AC coefficient being decoded, is initialized to zero and a loop is entered to process each non-zero AC coefficient in turn. A sixteen-bit string of compressed code is loaded into the C-register (e.g. of FIG. 5 or 5A) and n, the number of bits in a valid Huffman code is determined by parallel or sequential comparisons, as described above and depicted at 83. Once n is known, the corresponding offset(n) is also known, a pointer to a Huffman table address, C[0 . . . n−1]+offset(n), is computed (e.g. FIG. 6) and the S value is extracted from the R/S byte in the Huffman table by right-shifting the RIS value by four bits, as shown at 84. The compressed data is then shifted (left) by n bits (corresponding to the length of the Huffman code) to present the AC coefficient value in the data stream, as shown at 85.

to present this data in the format of FIG. 10, R is removed from the R/S value by ANDing bits of the R/S values with a hexadecimal OF byte, the R/S byte is stored and S extra bits are stored in two additional bytes and the compressed data is shifted (left) S bits to present the next Huffman code at the beginning of the C-register, as shown at 86. The value of k is then incremented by R+1 to decode the next non-zero AC coefficient. To complete the packed data format, the R/S value is tested at 88 and, if 0, signifying and end-of-block (EOB) the length byte is stored, as depicted at 90. If not, the incremented value of k is tested at 89 and, if equal to 63, the maximum number of AC coefficients in a block, an R/S value of 0 is stored to indicate an EOB and the length byte is stored. If k is less than 63, the process loops to 83 to process further AC coefficients.

Figure 9A:
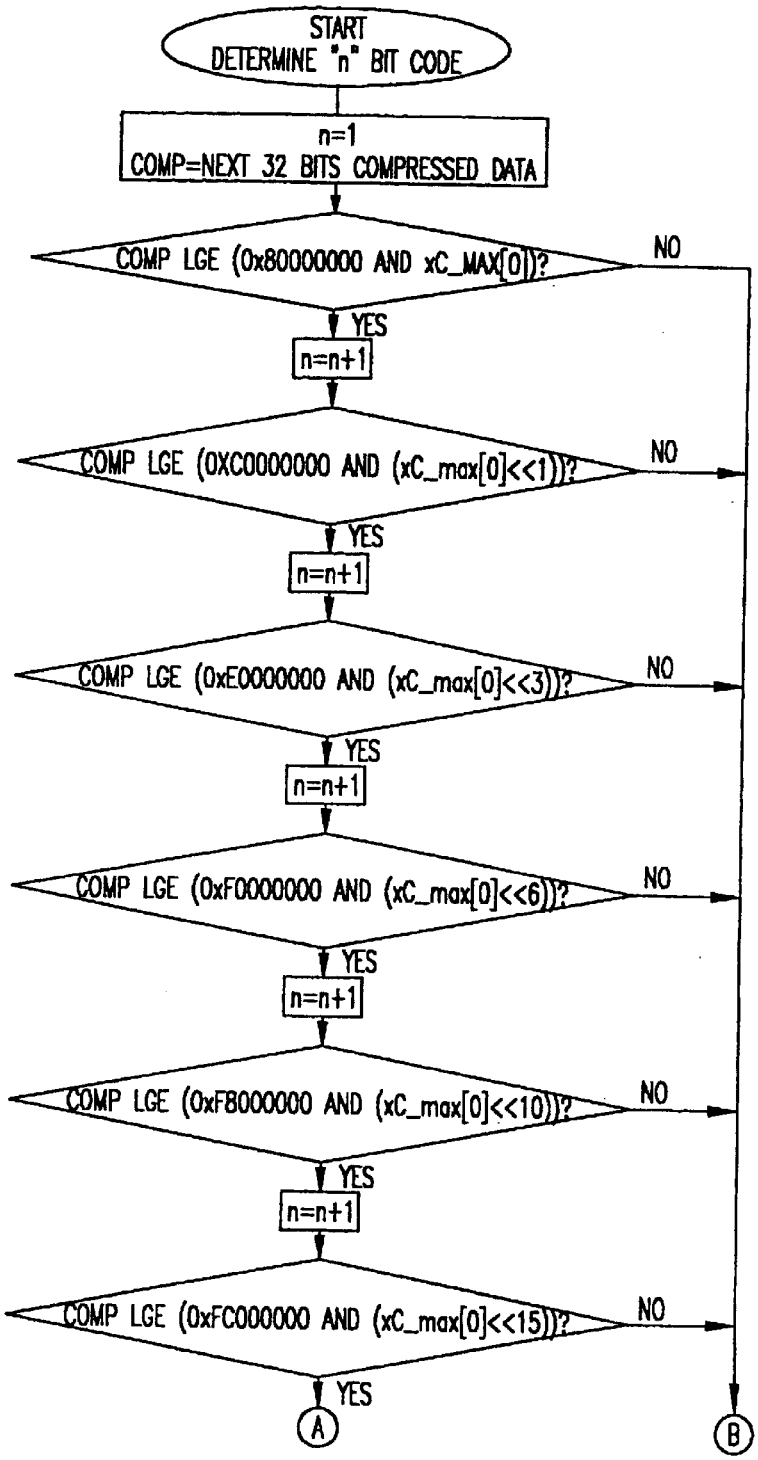
FIGS. 9A, 9B and 9C are a flow chart depicting a preferred feature of the process of FIG. 8.
Figure 9B:
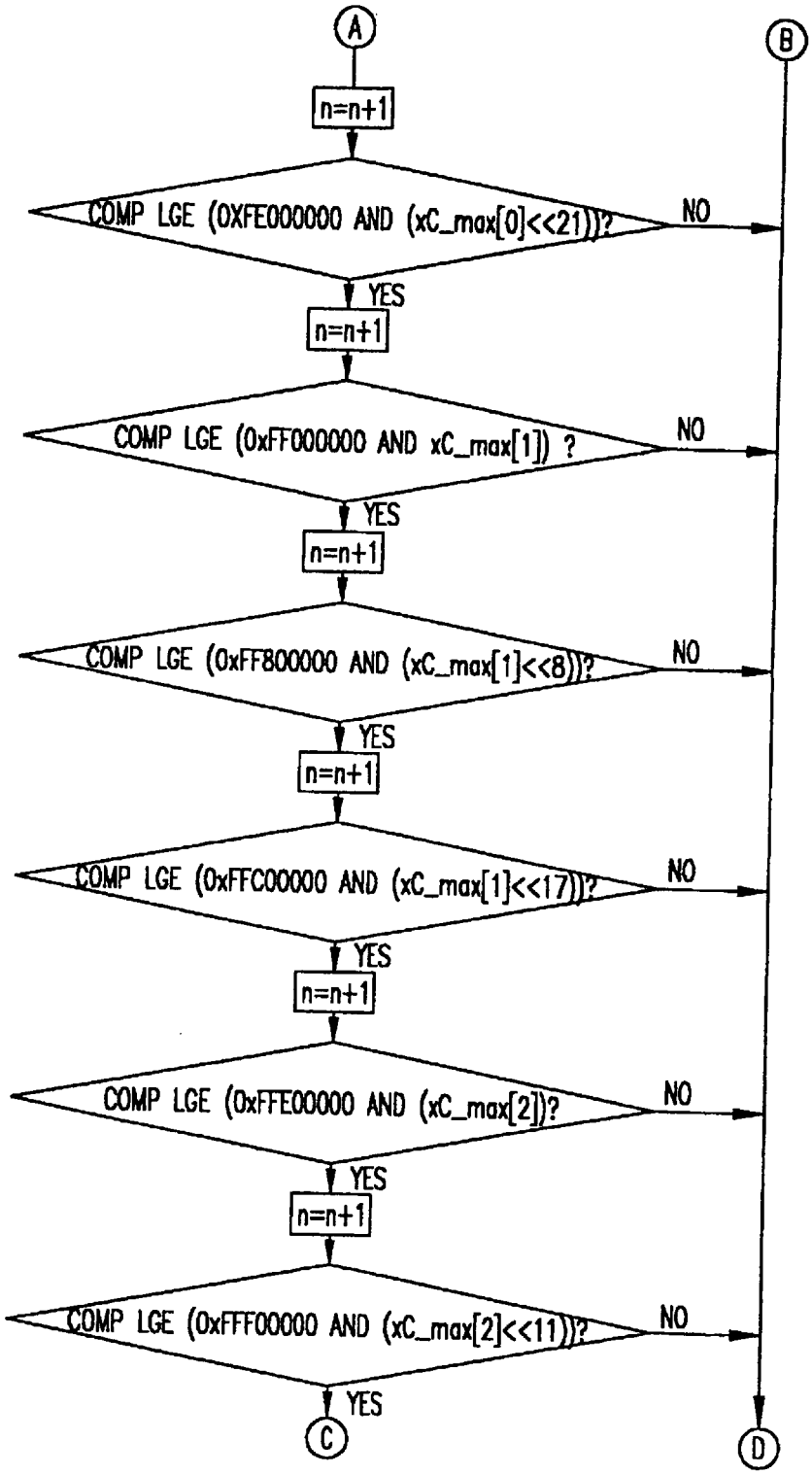
Figure 9C:
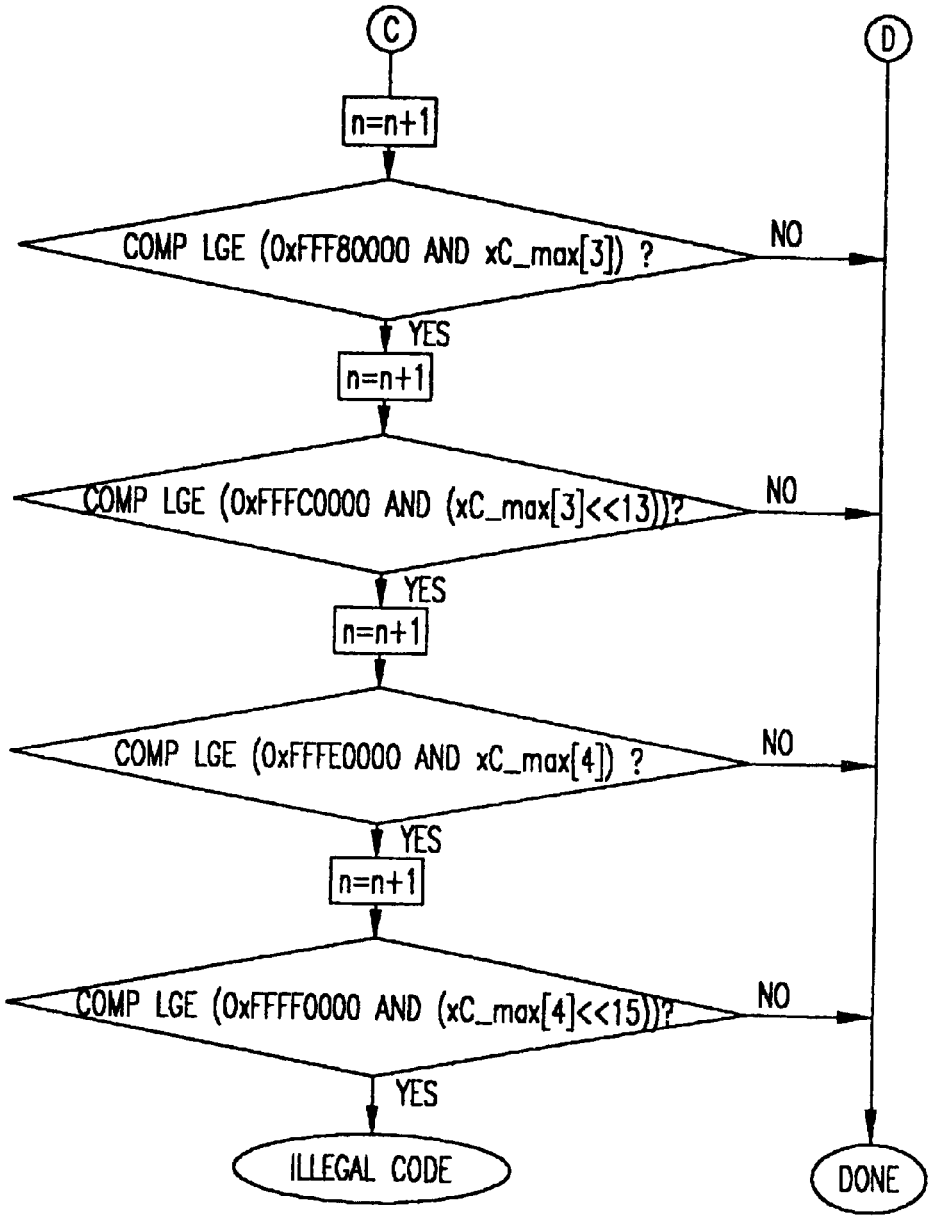

A perfecting feature of the process of FIG. 8 is shown in FIGS. 9A–9C. This feature of the invention packs the max(n) values into five xC_max<0 . . . 4>32-bit words which can then be stored and manipulated in registers to avoid the need for numerous memory accesses to obtain values for comparisons in accordance with, for example, the hardware arrangements of FIG. 5 or 5A.

The max(n) values are tightly packed into words as follows:

XC_max<0>=max(1),max(2), max(3),max(4),max(5), max (6),max(7),0000=32bits;

xC_max<1>=max(8),max(9),max(10),00000=32 bits;

xC_max<2>=max(11),max(12),0000000000=32 bits;

xC_max<3>=max(13),max(14),00000=32 bits; and xC_max<4>=max(15),max(16),0=32 bits.

These values are manipulated as depicted in FIGS. 9A–9C in performing step 83 of FIG. 8. Specifically, to determine the number of bits n in the Huffman code, the value of n is initialized to 1 and a register or variable (comp) is loaded with the next thirty-two bits of compressed data. Comp is logically compared to the most significant bit of xC_max<0>. If it is logically greater than or equal to that bit, the Huffman code is not 1-bit and n is incremented to 2. The sequence of comparisons shifts the next max(n) value into the most significant bits of a register and compares one more bit to the comp value, incrementing n for each access. When comp fails the greater than of equal to comparison, the number of bits has been found and the comparison sequence is done. Some RISC architectures have a one cycle copy into a register, mask and shift instruction, assuming that n, comp and the xC_max values are in registers, it takes three cycles to determine if n needs to be larger and no storage access are required. Therefore, the comparison testing operation can be executed very quickly, particularly since shorter Huffman codes occurs more frequently than longer codes.

The above description of the decoder and decoding process in accordance with the invention is thus seen to provide very significant increase of speed and responsiveness in reconstructing image data compressed in accordance with the JPEG standard and, by the same token, substantial reductions in data processing hardware and/or software requirements. Significant advantages are also provided in the encoding process in combination with the packet data format disclosed in the above-incorporated, concurrently filed application. The intermediate data format disclosed therein is illustrated in FIG. 10.

Figure 11:
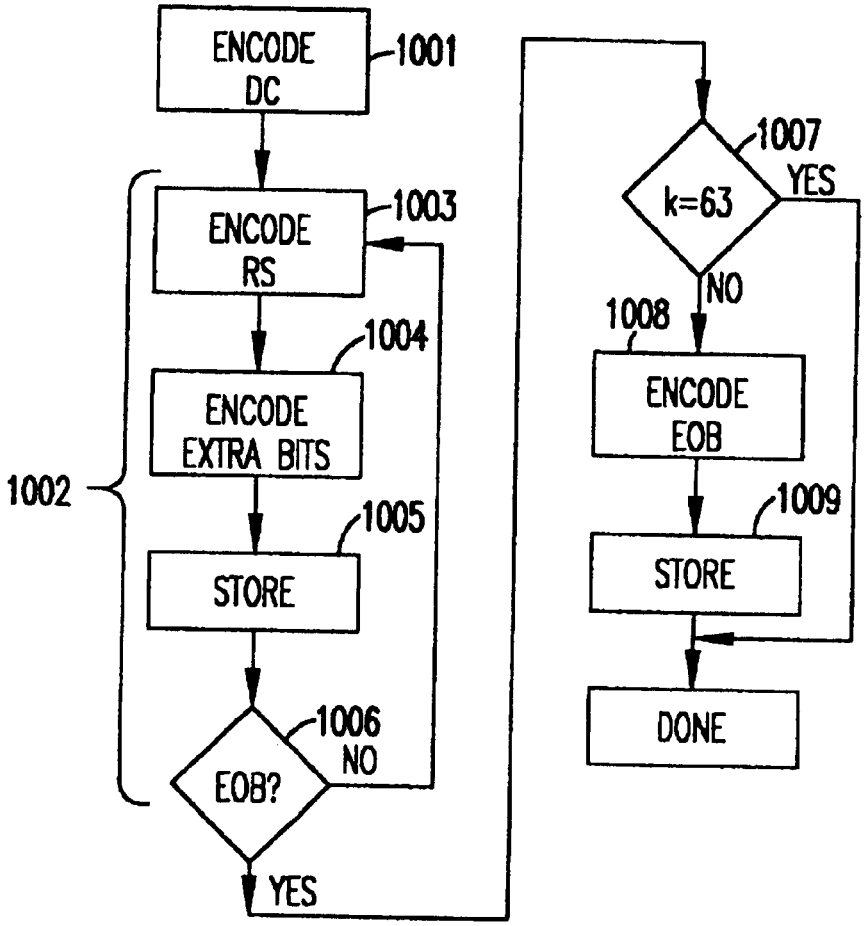
FIG. 11 is a block diagram of an encoder in accordance with the invention.

FIG. 11 shows a flowgraph for encoding a packed DCT block into entropy encoded data. The DC coefficient is encoded first 1001 and then a loop 1002 is entered. Each execution of the loop performs encoding of the R/S byte 1003, encoding of the extra bits 1004 in accordance with the S value 1004 and storage of both 1005. If an EOB code is found at 1006, the process branches (for the current block) and k is tested to determine if K=63 at 1007. If so, the process is complete since k=63 indicates the maximum number of values that can be provided and no EOB symbol need by separately encoded. If k is less than 63, the EOB is encoded 1008 and stored 1009 to complete the process. It should be noted that each entry is already in roughly the form required for the Huffman encoded data and the process can proceed with maximum speed to encode each R/S and extra bits pair in turn until the EOB marker is reached.

During encoding R/S bytes must be converted to a Huffman code. The packed data format of FIG. 10 is particularly advantageous for collection of the statistical data by which the Huffman codes are assigned to R/S values. That is, one pass through the block of data will allow counting of the number of occurrences of each R/S value and assignment of Huffman codes and the $L_i$ values to be transmitted. Before the second pass through the data, the actual R/S values used are assembled for transmission as $V_{ij}$ symbol values for transmission as part of the format of FIG. 1. Since the categories within each Huffman code length, n, can be arbitrarily assigned, instead of storing max(n) a value of seed(n) is defined for the first Huffman code of length n and which is numerically equal to 2*max(n−1).

Figure 12:
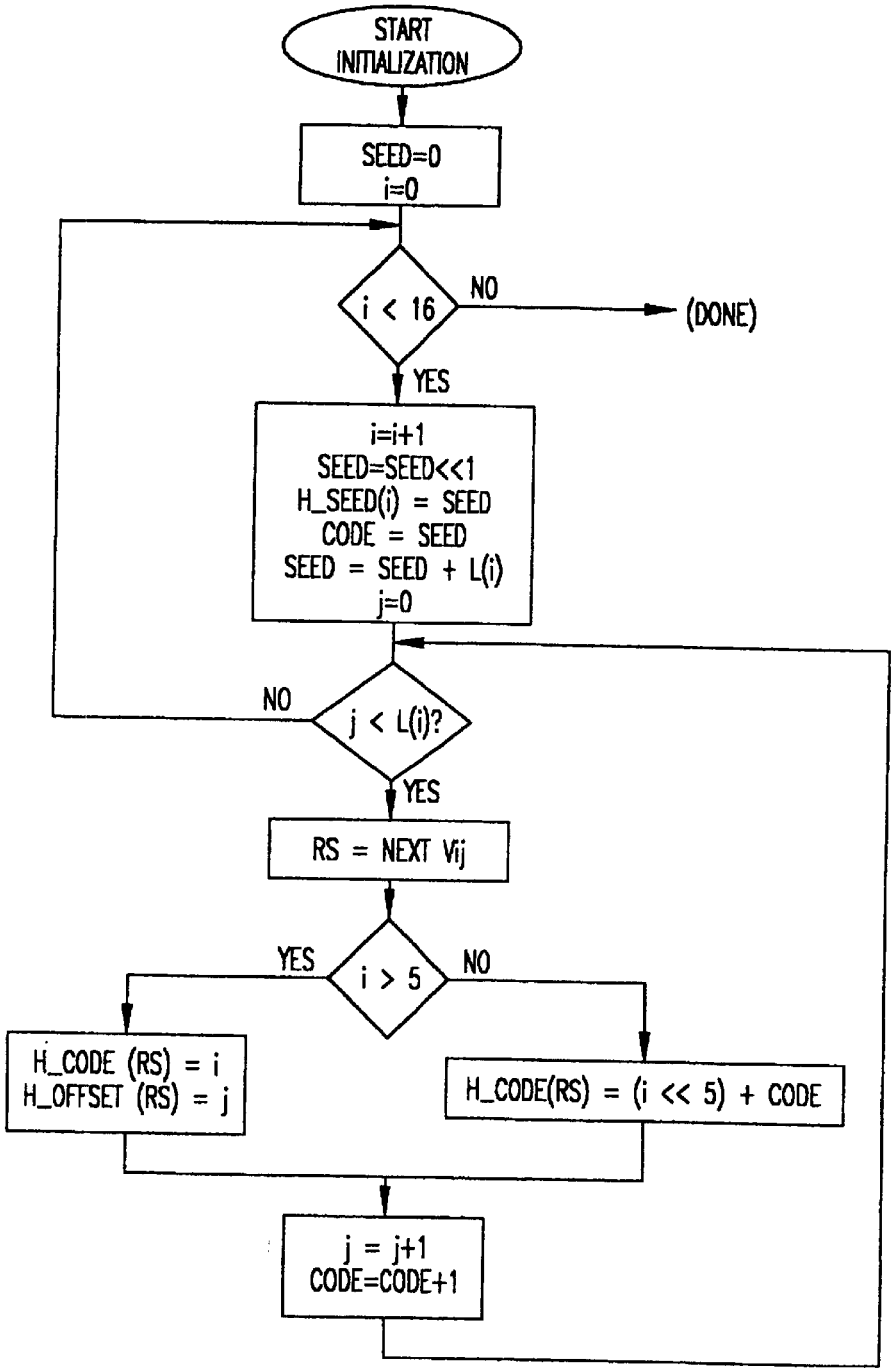
FIG. 12 illustrates initialization of the encoder tables.

FIG. 12 is a flow chart of initialization of the $H_{13}$ code, H_offset and H_seed tables. The starting seed (i.e. the first code word with the smallest numeric value for a given number of bits) is initialized to zero. The number of bits (i.e. the code word length) in the code word is initialized to zero.

Then, as long as i is less than 16, i is incremented by 1, the seed is doubled and stored in H_seed(i). The code is set to seed and then seed is incremented by a number of i-bit codes and j is initialized to zero.

As long as j is less than the number of codes $L_i$, R/S is set to the next $V_{ij}$ symbol value in the Define Huffman Table (DHT) marker segment. If the number of bits in the code is less than six, the number of bits and the code are packed into H_code(RS) with three most significant bits in the byte set to the number of bits in the code and the low order five bits set to the code. If i is greater than five, the H_code(RS) is set to the number of bits. Then H. . .offset(RS) is set to j, since this is the j+1th code of the i-bit codes. Both j and code are incremented for both paths.

For software implementations, the H_seed table entries are likely to be implemented as integers of at least sixteen bits since the longest seed is sixteen bits. For hardware, the nth entry only needs to be n bits because it is the seed for codes of n bits. For simplicity in FIG. 12, the H_seed table is initialized for seventeen entries (0–16). The flow chart shown in FIG. 13 can only use the 6th through the 16th entries Again, hardware embodiments may take advantage of this to reduce the number of loadable registers.

Each DC and AC Huffman table needs a set of H_seed, H_code and H_offset tables. Fortunately, for baseline implementations, the DC H_code and H_offset tables need only twelve entries since R=0 and the maximum value of S is 11. For generic implementations, the maximum value of S is 16, making a maximum of seventeen entries for these tables.

For simplicity, the H_code and H_offset tables are likely to have 256 entries each because most of the R/S bytes may be used. The entries in these tables are, at most, a byte. Therefore, instead of needing a 16-bit code word entries plus more bits to signify the number of bits in the code words, a small H_seed table is used for the longer code words and only an extra byte is needed to calculate the final code word of that size. All of the short codes (i.e. less than five bits) are contained in the H_code byte. Since the more frequent symbols will have shorter codes, a single byte access to storage contains everything needed for the most commonly coded symbols.

Figure 13:
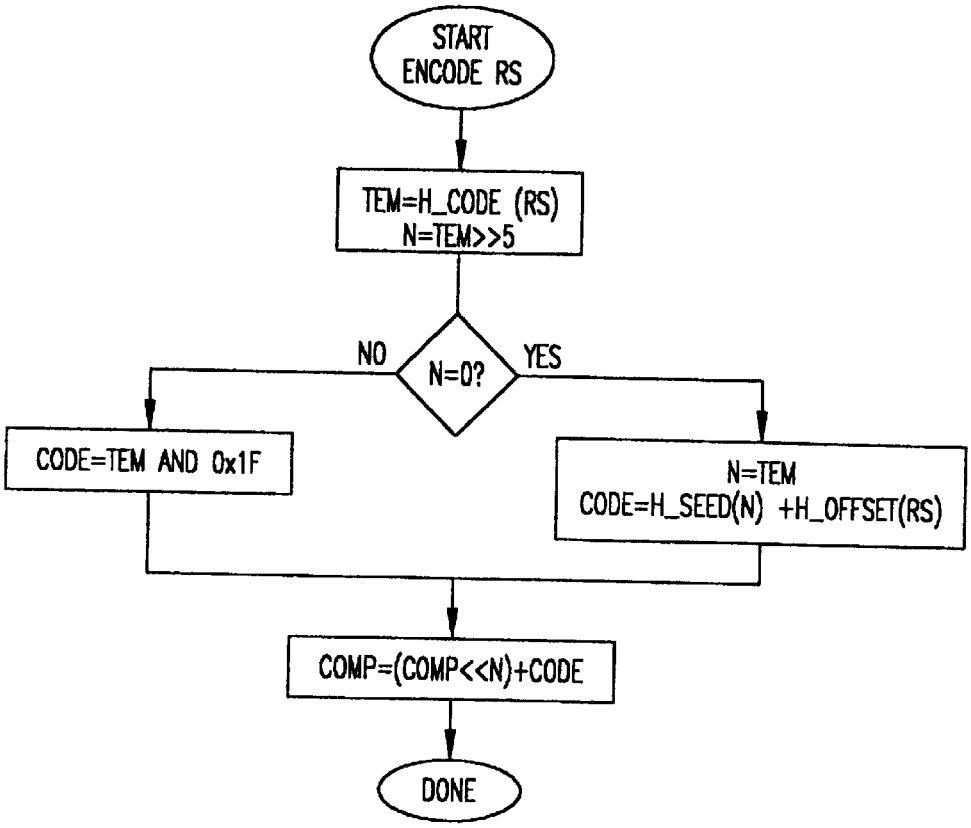
FIG. 13 illustrates a preferred implementation of a portion of FIG. 11.

FIG. 13 provides additional detail for the encode R/S block 1003 of FIG. 11. A temporary variable or register tem is set to the contents of the H_code(RS). The value of n is set to the three most significant bits of the byte. If n is zero, then n is set to tem and the code is generated by adding H_seed(n) to H_offset(RS). Otherwise, code is set to the low five bits of tem. The compressed data is shifted left n bits and the code put into those n low order bits. Comp is treated like a continuous barrel shifter and the process of outputting 32-bit words is well-known to those skilled in the art.

In the prior art, n and the bit pattern of up to 16 bits are stored for up to 256 R/S symbols. In accordance with the invention, however n and the code word are stored in a byte when both can be stored in a total of eight bits or less. This allows the Huffman tables to be considerably shortened and is particularly advantageous since most of the codes encountered will be short enough for this format to be used. Use of this format is indicated by a non-zero value in the three MSB locations of the byte.

For all longer bit patterns, only a length indication is stored as S and the high order nibble is set to 0000 to indicate a different format. For these longer codes, the length is used as an index to the seed (i.e. the first code value of a particular bit length). A corresponding offset (which fits in a byte since the maximum offset is 255) can then be determined from a look-up table to add to the seed to create the code value. After the R/S byte is encoded and stored, the extra S bits are encoded, preferably by shifting to develop a variable length from the two bytes of each AC coefficient value in the intermediate data format of FIG. 10.

In view of the foregoing, it is seen that the invention provides increased efficiency of data processing for encoding, and greatly increased efficiency of computation and storage of tables for indexing into the Huffman tables. These advantages are produced in a manner which is fully compliant with the JPEG standard and are applicable to all applications of Huffman coding.

While the invention has been described in terms of a single preferred embodiment in terms of the JPEG standard, those skilled in the art will recognize that the invention can be practiced with modification within the spirit and scope of the appended claims. For example, these fast encoding and decoding methods apply to any Huffman table which is constructed from the number of codes of each length in ascending order. Further, those skilled in the art will be enabled from the above description of the invention to apply the above-described techniques to Huffman tables constructed in descending order.

Having thus described our invention, what we claim as new and desire to secure by Letters Patent is as follows:

1. A method of Huffman encoding symbols comprising steps of defining a seed value for the first occurrence of a code of a given length in a table, storing a length of a code word, storing said length and said code word in a first format when a number of bits of said [number] *length* and said code word are less than or equal to a predetermined number of bits, and storing an index to said seed value, an offset and said code word in a second format when said [number] *length* and said [image data] *code word* comprise a number of bits greater than said predetermined number of bits.

2. A method as recited in claim 1, wherein said symbols are JPEG R/S bytes.

3. A method recited in claim 1 wherein said code [words are] *represents compressed* image data.

4. A method as recited in claim 3, wherein said image *compressed* data is JPEG *compressed* image data.

5. A method of Huffman decoding compressed data including the steps of testing bits of a data stream with each of a plurality of test criteria to determine a length of a valid Huffman code, combining one of a plurality of offsets corresponding to said length with said valid Huffman code to form an index, and accessing a symbol value in a Huffman table using said index.

6. A method as recited in claim 5, including the further step of computing said test criteria and said plurality of offsets from Huffman table data.

7. A method recited in claim 5 wherein said [compressed] data [are] *stream is compressed* image data.

8. A method as recited in claim 7, wherein said *compressed* image data is *compressed* JPEG image data.

* * * * *